United States Patent [19]

Buckle et al.

[11] Patent Number: 4,458,305

[45] Date of Patent: Jul. 3, 1984

[54] MULTI-PHASE TRANSISTOR/DIODE BRIDGE CIRCUIT

[75] Inventors: Allan S. Buckle, Kenilworth; Philip W. Allso, Solihull, both of England

[73] Assignee: Lucas Industries plc, Birmingham, England

[21] Appl. No.: 377,422

[22] Filed: May 12, 1982

[30] Foreign Application Priority Data

May 12, 1981 [GB] United Kingdom ............... 8114521

[51] Int. Cl.³ ....................................... H02M 7/537
[52] U.S. Cl. ................................... 363/141; 363/132; 363/144
[58] Field of Search ............... 363/123, 127, 132, 141, 363/144; 357/75, 81; 361/387, 388

[56] References Cited

U.S. PATENT DOCUMENTS

| 4,218,694 | 8/1980 | Grzybowski | 357/81 |
| 4,316,243 | 2/1982 | Archer | 363/132 |
| 4,367,523 | 1/1983 | Urba | 363/41 |
| 4,394,530 | 7/1983 | Kaufman | 357/81 |

FOREIGN PATENT DOCUMENTS

| 9978 | 4/1980 | European Pat. Off. | 357/81 |
| 47909 | 9/1979 | Japan | 363/132 |
| 158950 | 11/1963 | U.S.S.R. | 363/132 |

Primary Examiner—William H. Beha, Jr.
Attorney, Agent, or Firm—Holman & Stern

[57] ABSTRACT

A three-phase bridge circuit includes two sets of transistor/diode assemblies in which the diode of each assembly is connected in reverse current mode across the main current path of its transistor. Each diode of one set has its cathode connected to a positive d.c. input bus bar and its anode to a respective a.c. output bus bar. Each diode of the second set has its cathode connected to a negative d.c. input bus bar and a respective a.c. output bus bar. An input terminal has a plurality of electrical contacts, each connected to the control electrode of a respective transistor in the transistor/diode assemblies. A heat sink has its electrically insulating layer on one major surface thereof and in thermal contact therewith. Each transistor is in thermal contact with the heat sink by way of a bus bar part, and each of the bus bar parts is secured to the insulating layer so as to be in thermal contact with the heat sink.

1 Claim, 7 Drawing Figures

MULTI-PHASE TRANSISTOR/DIODE BRIDGE CIRCUIT

This invention relates to a multi-phase bridge arrangement particularly, but not exclusively, for use in a power unit for driving an a.c. induction motor of 10–100 kW rating.

Such high power electric motors are used in, for example, powering electrically driven vehicles.

At the present time electronic control of electric motors is becoming common with motors rated at up to 10 kW but cost, particularly of the power semi-conductor devices, is a major fact limiting the introduction of electric motor drives rated between 10 kW and 100 kW. In general, there are two types of electronically controlled electric drive systems currently available using either a d.c. motor or an a.c. motor. The d.c. motor drive systems employ chopper-type controllers and have the advantage of being economical in their use of expensive semi-conductor devices. However d.c. motor drive systems suffer a considerable cost and weight penalty as compared with a.c. motors of similar rating. Moreover, d.c. motors require brush gear which not only limits the maximum speed of the motor, but also requires maintenance and ventilation. These drawbacks are absent with a.c. induction motors which are brushless, totally enclosed and can be operated at high speed. At the present time, however, the power control units required to drive a.c. induction motors rated between 10 and 100 kW employ expensive thyristor bridge arrangements (the typical manufacturing cost of a 44 kW bridge inverter being ƒ 800) and this is a major factor inhibiting the development of a.c. motor drive systems. An object of the present invention is therefore to overcome or alleviate this disadvantage.

Accordingly, the invention resides in a multi-phase bridge arrangement comprising first and second d.c. input bus bars, at least two a.c. output bus bars, the number of said output bus bars being equal to the number of phases of the a.c. output to be produced in use, first and second sets of transistor/diode assemblies, each transistor/diode assembly of the first set being electrically connected between the first d.c. input bus bar and a respective one of the a.c. output bus bars, and each transistor/diode assembly of the second set being electrically connected between the second d.c. input bus bar and a respective one of said a.c. output bus bars, each transistor/diode assembly including a diode which is electrically connected in reverse conduction mode across the current carrying zones of a transistor, with the cathode zone of the diode and the interconnected zone of the transistor of each assembly of the first set of assemblies being electrically connected to the positive d.c. input bus bar, the anode zone of the diode and the interconnected zone of the transistor of each assembly of the first set of assemblies being electrically connected to a respective one of said a.c. output bus bars and with the anode zone of the diode and the interconnected zone of the transistor of each assembly of the second set of assemblies being electrically connected to the negative d.c. input bus bar, the cathode zone of the diode and the interconnected zone of the transistor of each assembly of the second set of assemblies being electrically connected to a respective one of said a.c. bus bars, an input terminal having a plurality of electrical contacts each being electrically connected to the control zone of the transistor of a respective one of said transistor/diode assemblies, and a heat sink having an electrically insulating layer on one major surface thereof and in thermal contact therewith, each transistor being in thermal contact with the heat sink by way of a bus bar part to which it is connected, each of the bus bar parts being secured to said insulating layer so as to be in thermal contact with the heat sink.

In the bridge arrangement described in the preceding paragraph, the use of transistor/diode assemblies in place of thyristors simplifies the overall construction of the bridge and reduces its cost. Moreover, the bridge arrangement described in the preceding paragraph is susceptible to automated production using low cost assembly techniques.

It will be recognised that the transistors mentioned in the preceding paragraph can be bi-polar transistors or field effect transistors. In the event that bi-polar transistors are used then the reference to current carrying zones is to be construed as a reference to emitter and collector zones and the reference to a control zone is to be construed as a reference to a base zone. In the event that field effect transistors are utilized then the reference to current carrying zones should be construed as a reference to source and drain zones and the reference to a control zone should be construed as a reference to a gate zone.

Preferably, where bi-polar transistors are used each transistor is an n-p-n device and the collector zone of each transistor of the first set of transistor/diode assemblies is in thermal contact with the heat sink by way of part of the positive d.c. input bus bar, while the collector zone of each transistor of the second set of transistor/diode assemblies is in thermal contact with the heat sink by way of part of a respective output bus bar.

Preferably, where field effect transistors are used each transistor is an n-channel device and the drain zone of each transistor of the first set of transistor/diode assemblies is in thermal contact with the heat sink by way of part of the positive d.c. input bus bar, while the drain zone of each transistor of the second set of transistor/diode assemblies is in thermal contact with the heat sink by way of part of a respective a.c. output bus bar.

In the accompanying drawings.

Figure 1:
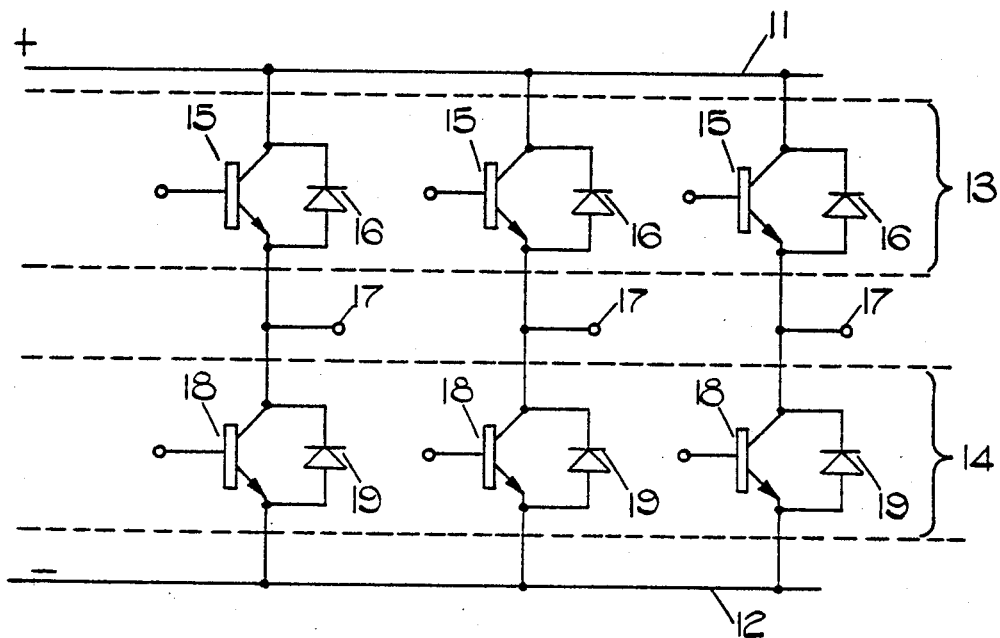
FIG. 1 is a circuit diagram of a three-phase bridge arrangement according to a first example of the invention.

Referring to FIG. 1, the bridge arrangement of the first example includes positive and negative d.c. input lines 11, 12 between which are connected first and second sets of transistor/diode assemblies 13, 14 respectively. Each of the three transistor/diode assemblies 13 of the first set includes an n-p-n transistor 15 having a diode 16 connected in reverse conduction mode across the collector-emitter zone of the transistor. Thus the collector of each transistor 15 is connected to the cathode of its associated diode 16, while the emitter of the transistor is connected to the anode of the diode. Moreover, each transistor/diode assembly 13 is connected between the positive input line 11 and one of three output terminals 17, with the collector and cathode of the associated transistor and diode being connected to the supply line 11 and the transistor emitter and diode anode being connected to the output terminal 17. Similarly each of the transistor/diode assemblies 14 of the second set includes an n-p-n transistor 18 having a diode 19 connected in reverse conduction mode across its collector-emitter zones. Moreover, each of the assemblies 14 is connected between a respective one of the output terminals 17 and the negative input line 12, but in this case the collector and cathode of the associated transistor and diode are connected to the terminal 17, while the transistor emitter and diode anode are connected to the input line 12. In use, the input lines 11, 12 are connected to a d.c. supply (not shown) while the base zones of the transistors 15, 18 are connected to a control unit (not shown) which supplies a series of pulse signals to the bases of the transistors. It will be appreciated that by applying the pulses in the correct sequence it is possible to produce at the terminals 17 an output in the form of a pulse width modulated three-phase sine waveform of variable frequency.

In one practical embodiment, in which the bridge of the first example was required to control a 20–25 kW three-phase a.c. induction motor powered by a 250 volt d.c. source, each transistor 15, 18 had a rating of 170 amps and 400 volts, whereas each diode 16, 19 was a fast recovery diode rated at 170 amps, line 11 was at +250 volts and line 12 was at 0 volts.

Figure 2:
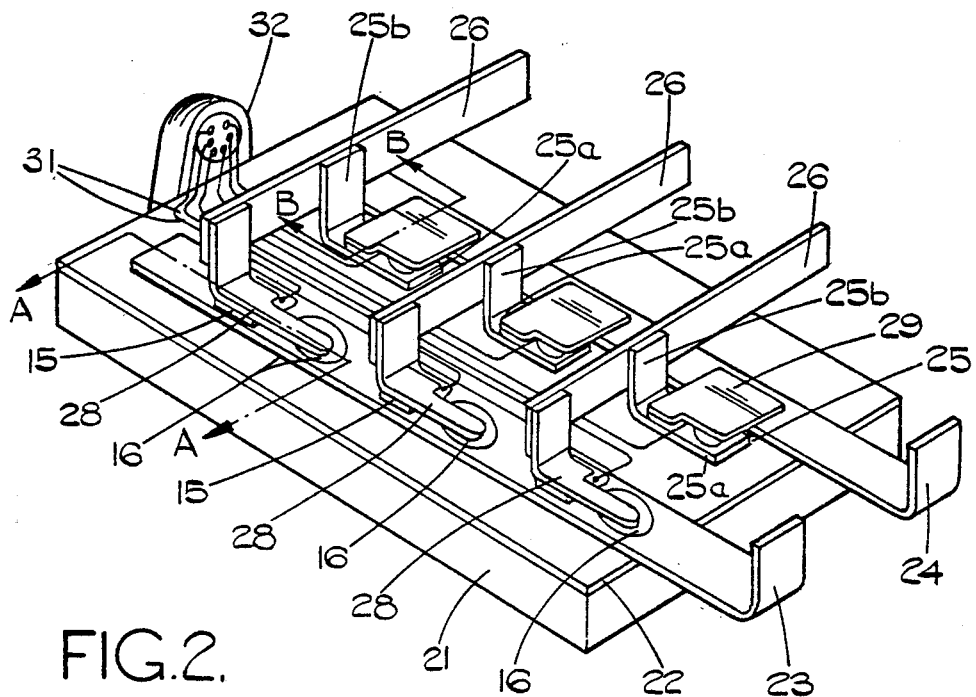
FIG. 2 is a plan view of the bridge arrangement shown in FIG. 1.
Figure 3:
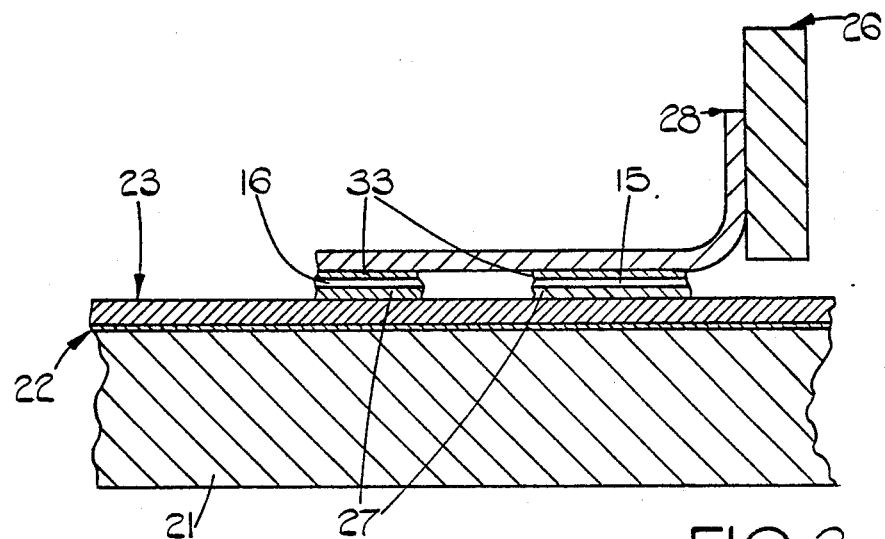
FIGS. 3 and 4 are sectional views along the lines A—A and B—B respectively in FIG. 2.
Figure 4:
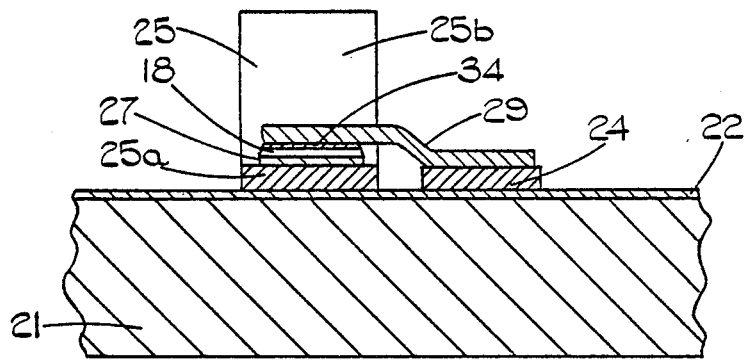

Referring to FIGS. 2 to 4, the bridge of the first example is constructed in a planar, generally rectangular copper heat sink 21, which in said one practical embodiment had a length of 150 mm, a width of 100 mm and a thickness of 10 mm. Plasma sprayed on one major surface of the heat sink 21 is a ceramic layer 22 conveniently 0.1 mm thick, which provides a continuous, electrically insulating film in good thermal contact with the heat sink 21. A nickel coating (not shown) conveniently 0.01 mm thick, is flame sprayed over the regions of the ceramic layer 22 on which components of the bridge arrangement are to be mounted.

Soldered onto the ceramic layer 22 by way of the nickel coating are first and second d.c. input bus bars 23, 24 respectively which define the positive and negative input lines 11, 12 respectively. The bus bars 23, 24 are defined by elongate copper strips which extend in parallel spaced relationship over substantially the full length of the heat sink 21. At one end, each bus bar 23, 24 projects from the heat sink and is bent to define an upwardly extending tab to which external electrical connections can be made. In said one practical embodiment, each bus bar 23, 24 was formed from a nickel-plated copper strip 1.5 mm thick, 20 mm wide and 200 mm long and was joined to the layer 22 using a 40% lead/60% tin solder.

Also soldered to the ceramic layer 22 are three a.c. output bus bar extensions 25 which are located between and spaced from the bus bars 23, 24. Each extension 25 is in the form of a generally L-shaped nickel-plated copper strip having its major limb 25a soldered to the ceramic layer 22 and its minor limb 25b secured to a further part 26 of an a.c. output bus bar in the form of a copper strip. In said one practical embodiment, each extension 25 was 1.5 mm thick and 20 mm wide, with the major limb 25a being 35 mm long and the minor limb being 15 mm long. Again a 40% lead/60% tin solder was used to secure each major portion 25a to the ceramic layer 22.

Connected to the bus bar 23 by way of nickel-plated molybdenum pads 27 (FIG. 3) are the transistors 15 and diodes 16. Each transistor chip 15, which conveniently is of square configuration, is joined to the bus bar 23 so that its collector zone is electrically and thermally connected to the bus bar 23 while each diode 16, which conveniently is of circular configuration, is joined to the bus bar 23 so that its cathode is thermally and electrically connected to the bus bar. The transistor 15 and diode 16 of each assembly 13 are mounted adjacent each other on the bus bar 23 and in alignment with the major limb 25a of one of the extensions 25. The emitter zone of each transistor 15 and the anode of its associated diode 16 are electrically connected via nickel-plated molybdenum pads 33 to one limb of a respective L-shaped, nickel-plated copper link 28, the other limb of which is secured to one of the a.c. output bus bar parts 26.

Each transistor 18 and its associated diode 19, which again are of square and circular configuration respectively, is connected by way of a further nickel-plated molybdenum pad 27 (FIG. 4), to the major limb 25a of a respective one of the extensions 25. In this case, however, the arrangement is such that the collector zone of each transistor 18 and the cathode of its associated diode 19 are thermally and electrically connected to the extension 25. Further nickel-plated copper links 29 then connect, via nickel-plated molybdenum pads 34, the emitter zones of the transistors 18 to the anodes of their associated diodes 19 and to the bus bar 24.

The links 28, 29 are shaped so as to expose the base zones of the transistors 15, 18 at the uppermost surface of the respective devices. Connected to the exposed base zones are respective leads 31 which extend over the ceramic layer 22 and are joined at their free ends to respective pins of a multi-pin control terminal 32 which is provided at the opposite end of the heat sink 21.

The a.c. output bus bars 26 extend transversely to the d.c. input bus bars 23 and project from one side edge of the heat sink 21 to allow external and electrical connections to be made thereto. The three a.c. output bus bars 26 (25, 28) are referred to in FIG. 1 as the output terminals 17. Thus, in use, when a d.c. source is connected across the bus bars 23, 24 and the required sequence of control pulses is fed to the base zones of the transistors 15, 18 by way of the terminal 32 and the leads 31, a three-phase a.c. output is obtained at the bus bars 26.

In practice, the bridge arrangement described in the preceding paragraph is manufactured as follows:

The nickel-plated molybdenum pads 27, which conveniently are 0.8 mm thick, are positioned on the bus bar 23 and on the a.c. bus bar extensions 25, whereafter the transistors and diodes are located on the appropriate pads. The upper nickel-plated molybdenum pads 33 are then placed on top of their associated devices, and the nickel-plated copper links 28, 29 are positioned on top of their associated device assemblies 13, 14 respectively, whereafter a diffusion bonding operation is carried out simultaneously to join the links 28, 29 to their associated molybdenum pads 33, the semi-conductor devices to their associated pads 33 and 27, and the pads 27 to the bars 23, 25.

After plasma spraying the ceramic layer 22 on the heat sink 21, and flame spraying the metal coating on the required areas of the ceramic layer, the bus bars 23, 24 and the major limbs 25a of the extensions 25 are soldered onto the metal coating. Using a 40% lead/60% tin, or similar solder this would be effected at about 230° C. At the same time, the links 29 are soldered to the bus bar 24, again using 40% lead/60% tin solder. Thereafter the strips 26 are soldered to the upstanding limbs of the extensions 25 and links 28 using 40% lead/60% tin or similar solder, and the leads 31 are soldered to the base zones of the transistors 15, 18, using 5% tin/95% lead or similar solder.

Figure 5:
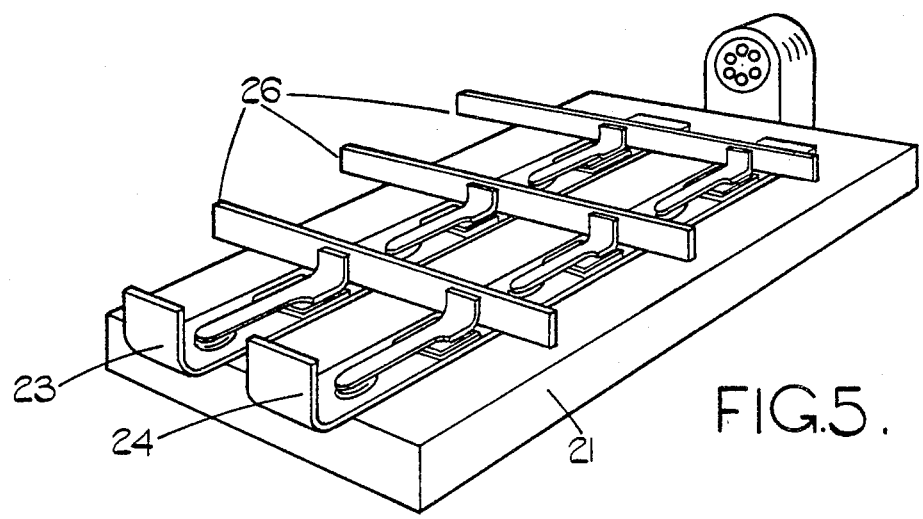
FIG. 5 is a plan view of a three-phase bridge arrangement according to a second example of the invention.

Referring now to FIG. 5, in the bridge arrangement of the second example the transistors of the first set of transistor/diode assemblies are again n-p-n devices, but the transistors of the second set of transistor/diode assemblies are now p-n-p devices. Thus, in the second example, both sets of transistors have their collector zones directly bonded to their associated bus bars 23, 24, without the need for the links 29 used in the first example. However, although this means that the bridge arrangement of the second example is of simpler construction than that of the first example, the arrangement in the first example is preferred since n-p-n transistors exhibit better operating characteristics than p-n-p devices in high power applications.

Figure 6:
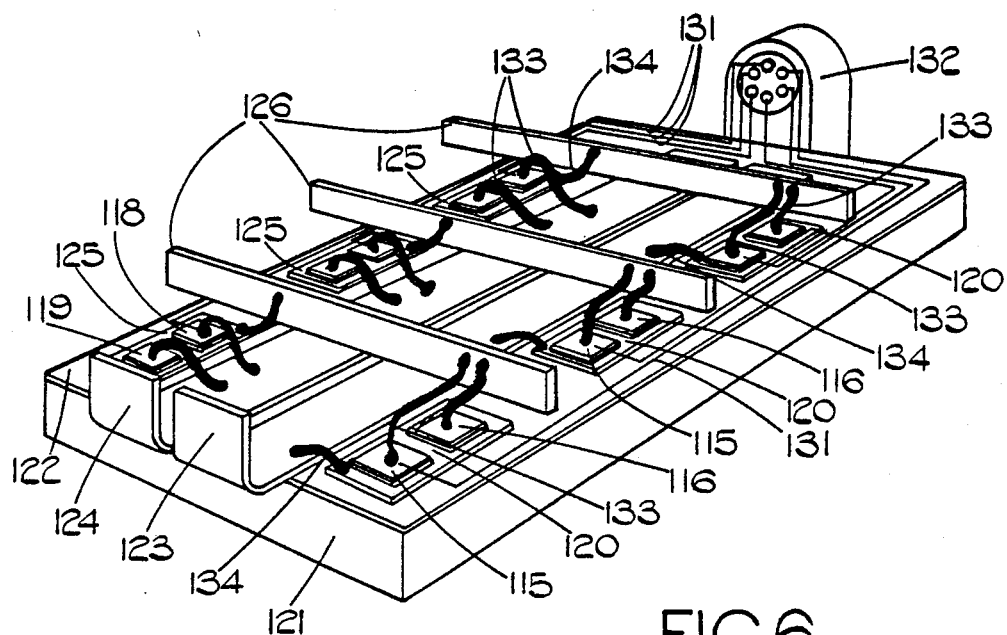
FIG. 6 is a perspective representation of a three-phase bridge arrangement according to a third example of the invention.
Figure 7:
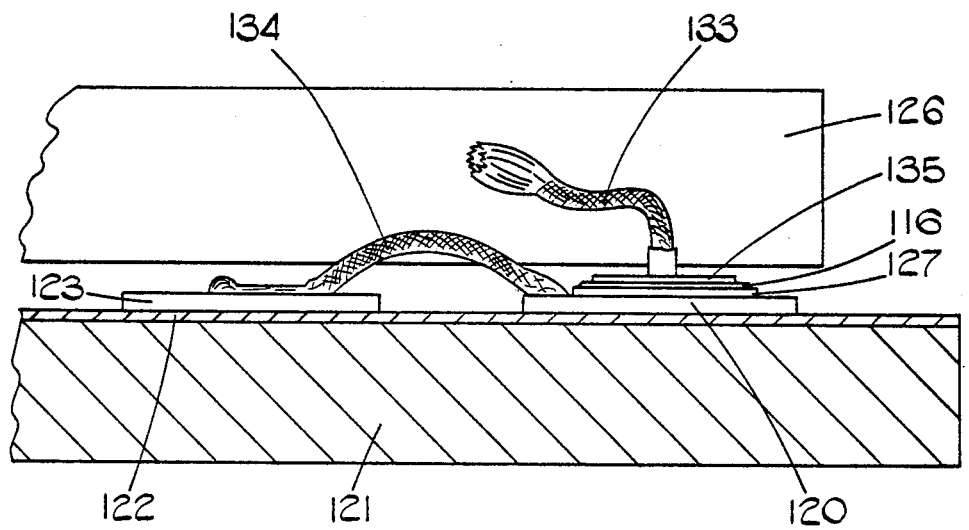
FIG. 7 is an enlarged sectional view of part of the arrangement of FIG. 6.

In the examples illustrated in FIGS. 6 and 7 the bridge arrangement is again constructed on a planar, generally rectangular copper heat sink 121, which, in a practical embodiment had a length of 190 mm, a width of 130 mm and a thickness of 10 mm. A thin ceramic layer 122 is deposited on one major surface of the heat sink 121 by a plasma spraying technique the layer 122 conveniently having a thickness of 0.1 mm, and providing a continuous electrically insulating film in good thermal contact with the copper of the heat sink.

Two sets of three bus bar extension pieces 120, 125, formed from nickel-plated copper are secured to the ceramic layer 122 by means of a thermally conductive epoxy resin adhesive. Conveniently each of the extensions 120, 125 has a length of 50 mm, a width of 20 mm and is 1.5 mm in thickness. It can be seen in FIG. 6 that the extensions 120 are spaced in a line parallel to the length of the heat sink 121 and parallel also to the line in which the extensions 125 are positioned.

Electrically connected, through the intermediary of a respective nickel-plated molybdenum pad 127, to each of the extensions 120 is the collector zone of a respective square shaped transistor chip 115 and the cathode of a square shaped diode chip 116. Square shaped diode chips 119 and transistor chips 118 are similarly electrically connected through the intermediary of nickel-plated molybdenum pads to the extensions 125, each transistor chip 118 having its collector zone electrically connected to the respective extension 125 and each diode chip 119 similarly having its cathode electrically connected to the respective extension 125. As mentioned previously with respect to the earlier examples the molybdenum pads positioned between the semi-conductor chips and their respective bus bar extensions serve not only to provide an electrical connection, but also to provide a thermal connection.

Engaged with the heat sink 121 (but not shown in the drawings) is a synthetic resin moulding which supports first and second d.c. input bus bars 123 and 124, and similarly supports three a.c. output bus bars 126. The output bus bars 126 are of course electrically isolated by the moulding from the bus bars 123, 124 and the remaining components on the heat sink. Similarly the bus bars 123, 124 are isolated by the moulding from the remaining components. As will be described later however specific electrical connections are provided between components and bus bars as necessary. The d.c. input bus bars 123, 124 correspond to lines 11 and 12 of FIG. 1, and each is securely held by the housing relative to the heat sink 121 extending parallel to the length of the heat sink 121 and between the rows of bus bar extensions 120, 125. The bus bars 123, 124 are defined by elongate copper strips and at one end each projects beyond the heat sink to define an upwardly extending tab to which external electrical connections can be made. In said one practical embodiment each bus bar 123, 124 is formed from copper strip of 1.5 mm thickness, and has a width of 20 mm and a length of 200 mm.

The a.c. output bus bars 126 are held by the moulding extending transverse to the length of the heat sink 121 in parallel, spaced relationship over substantially the full width of the heat sink 121. The bus bars 126 project beyond one side edge of the heat sink 121 to permit external electrical connections to be made. In said one practical embodiment each of the bus bars 126 was formed from copper strip of 1.5 mm thickness and had a width of 20 mm and a length of 150 mm. Conveniently the bus bars 123, 124, 126 are engaged as a snap-fit in said synthetic resin moulding.

It will be recognised that the emitter zone of each transistor 115, 118 and the anode of each diode 116, 119 is presented upwardly. Physically and electrically connected to each transistor emitter zone and each diode anode is a respective flexible, stranded, copper, rope connector 133. The connectors 133 of the transistors 115 and diodes 116 have their opposite ends physically and electrically connected to the a.c. output bus bars 126, so that the emitter zone of the first transistor 115 and the anode of the first diode 116 are connected electrically to the first output bus bar 126, and similarly the second transistor 115 and diode 116 have their emitter zone and anode connected to the second bus bar 126 while the third transistor 115 and third diode 116 have their emitter zone and anode connected to the third output bus bar 126.

The connectors 133 of the transistors 118 and diodes 119 are physically and electrically connected to the d.c. input bus bar 124. Moreover, each of the bus bar extensions 120 and 125 has physically and electrically connected thereto one end of a similar copper rope connector 134. The opposite ends of the connectors 134 of the bus bar extensions 120 are each electrically and physically connected to the d.c. input bus bar 123 while the opposite ends of the rope connectors 134 of the extensions 125 are physically and electrically connected respectively to the three a.c. output bus bars 126. In said one practical embodiment all of the rope connectors 133, 134 were made from copper rope having the structure 7/36/0.122 mm.

The electrical connections to the base zones of the three transistors 115 and the three transistors 118 are made by way of conductive leads 131 which extend over the surface of the ceramic layer 122 and electrically connect the base zones of the six transistors to respective pins of a multi-pin control terminal 132 provided at one end of the heat sink 121.

It will be apparent that by virtue of the connectors 134 the extensions 120 constitute parts of the d.c. input bus bar 123, and the extensions 125 constitute parts of the a.c. output bus bars respectively.

It will be recognised therefore that when a d.c. source is connected across the bus bars 123, 124, and the required sequence of control pulses is fed to the base zones of the transistors 115, 118 by way of the terminal 132 and the leads 131, a three-phase a.c. output is obtained at the bus bars 126.

In practice, the bridge arrangement described above with reference to FIGS. 6 and 7 can be manufactured as follows:

The semi-conductor devices 115, 116, 118, 119 are pretinned at the wafer stage such that the base and emitter contact areas of each transistor and the anode contact area of each diode is coated with a 95% lead/5% tin solder or its equivalent. After dicing the wafer each separated device is soldered by its collector or cathode contact to a nickel plate molybdenum pad which conveniently is 0.8 mm thick, again using 95% lead/5% tin solder or its equivalent. Simultaneously with the soldering of the nickel-plated molybdenum pads flexible grid connectors 135 (FIG. 7) are attached to the emitter and anode contacts of the transistors and diodes respectively and separate lead frame connectors are attached to the base contacts of the transistors, the grid connectors 135 and the lead frame connectors being attached by reflow soldering. The flexible grid connectors 135 are fabricated from copper sheet of 0.25 mm thickness and prior to connectors to the semi-conductor devices the flexible grid connection have welded to them respective flexible stranded copper rope connectors 133 of 7/36/0.122 mm section.

Next one transistor and one diode are positioned adjacent one another on a respective bus bar extension 120, 125 and are secured to the respective bus bar extension through the intermediary of their respective molybdenum pad the lower face of which is secured to the bus bar extension 120, 125 by means of a solder having a lower melting point than that previously mentioned. Conveniently a 60% tin/40% lead solder or its equivalent is used for this operation. Prior to the securing of the devices to the extensions 120, 125 a respective copper rope connector 134 has had one of its ends welded to the extension 120, 125.

After plasma spraying the ceramic layer 122 onto the heat sink 121 the bus bar extension pieces 120, 125 (now carrying their respective semi-conductor devices and connectors 134) are attached to the ceramic layer 122 by means of thermally conductive epoxy resin adhesive which has been screen printed onto the layer 122 in appropriate positions. The aforementioned synthetic resin moulding (not shown) is then attached to the heat sink, and the d.c. input bus bars 123, 124 are introduced into the assembly and have the appropriate rope connectors 133, 134 welded thereto prior to snap engaging the bus bars 123, 124 in place within the synthetic resin moulding. Similarly the bus bars 126 are introduced into the assembly and the appropriate rope connectors 133, 134 are welded thereto before the bus bars 12 are snap engaged with the synthetic resin moulding.

Finally the leads 131 are soldered to the lead frame connectors of the base zones of the transistors 115, 118 using a 60% tin/40% lead solder or its equivalent thereby completing the electrical connections between the base zones of the transistors and the pins of the terminal 132.

It is to be understood that while in all of the examples described above the transistors referred to are bi-polar transistors it would be possible to substitute field effect transistors in place of the bi-polar transistors. Thus in each of the examples described above where an n-p-n transistor is referred to it could be replaced by an n-channel field effect transistor. Similarly the alternative p-n-p transistors described above, could be replaced by p-channel field effect transistors. In each instance it will be recognised that where the base zone, collector zone, and emitter zone of a bi-polar transistor is referred to then where a field effect transistor is utilized the equivalent references should be to the gate zone, the drain zone, and the source zone of the field effect transistor.

We claim:

1. A three-phase bridge arrangement including positive and negative d.c. input bus bars and first, second and third a.c. output bus bars, first and second sets of transistor/diode assemblies, each of said sets comprising three transistor/diode assemblies and each of said transistor/diode assemblies comprising a bipolar n-p-n transistor, and a diode which is electrically connected in reverse conduction mode across the current carrying zones of the transistor, each of the transistor/diode assemblies of said first set of assemblies having the cathode zone of its diode and the interconnected zone of its transistor electrically connected to said positive d.c. input bus bar and the anode zone of its diode and the interconnected zone of its transistor electrically connected to a respective one of said first, second and third a.c. output bus bars, each of said transistor/diode assemblies of said second set of assemblies having the anode zone of its diode and the interconnected zone of its transistor electrically connected to said negative d.c. input bus bar, and the cathode zone of its diode and the interconnected zone of its transistor electrically connected to a respective one of said first, second and third a.c. output bus bars, the bridge arrangement further including an input terminal having a plurality of electrical contacts each being electrically connected to the control zone of the transistor of a respective one of said transistor/diode assemblies, and a heat sink having an electrically insulating layer on one major surface thereof and in thermal contact therewith, the collector zone of each transistor of the first set of transistor/diode assemblies being in thermal contact with said heat sink by way of a respective one of three positive d.c. input bus bar extension pieces, which extension pieces are electrically connected with said positive d.c. input bus bar by way of respective flexible stranded connectors, the collector zone of each transistor of said second set of transistor/diode assemblies being in thermal contact with said heat sink by way of respective a.c. bus bar extension pieces each of which a.c. bus bar extension pieces is electrically connected with its respective first, second or third a.c. output bus bar by way of a respective flexible stranded connector, said electrical connection between said first, second and third a.c. output bus bars, and the respective anode and interconnected zones of the respective assemblies of the first set of transistor/diode assemblies being made by way of respective flexible stranded connectors, and, said electrical connections between said negative d.c. input bus bar and the anode and interconnected zones of the assemblies of the second set of transistor/diode assemblies being made by way of respective flexible stranded connectors.

* * * * *